United States Patent
Lohan et al.

(10) Patent No.: US 12,477,688 B2
(45) Date of Patent: Nov. 18, 2025

(54) SYSTEMS AND METHODS FOR COOLING ELECTRONIC DEVICES

(71) Applicant: Toyota Motor Engineering & Manufacturing North America, Inc., Plano, TX (US)

(72) Inventors: Danny J. Lohan, Northville, MI (US); Shailesh N. Joshi, Ann Arbor, MI (US); Ercan M. Dede, Ann Arbor, MI (US)

(73) Assignees: TOYOTA MOTOR ENGINEERING & MANUFACTURING NORTH AMERICA, INC., Plano, TX (US); TOYOTA JIDOSHA KABUSHIKI KAISHA, Toyota (JP)

( * ) Notice: Subject to any disclaimer, the term of this patent is extended or adjusted under 35 U.S.C. 154(b) by 197 days.

(21) Appl. No.: 18/140,925

(22) Filed: Apr. 28, 2023

(65) Prior Publication Data
US 2024/0365506 A1    Oct. 31, 2024

(51) Int. Cl.
*H05K 7/20*     (2006.01)
*F28D 15/02*    (2006.01)
(Continued)

(52) U.S. Cl.
CPC ......... *H05K 7/2029* (2013.01); *F28D 15/025* (2013.01); *F28D 15/0266* (2013.01);
(Continued)

(58) Field of Classification Search
CPC ........... H05K 7/20818–20827; F28D 15/0266; F28D 15/043
See application file for complete search history.

(56) References Cited

U.S. PATENT DOCUMENTS

| | | | |
|---|---|---|---|
| 6,519,955 B2 * | 2/2003 | Marsala | H01L 23/427 257/E23.098 |
| 6,615,912 B2 * | 9/2003 | Garner | F28D 15/043 165/274 |

(Continued)

FOREIGN PATENT DOCUMENTS

| | | |
|---|---|---|
| CN | 103890692 | 6/2014 |
| CN | 108471693 | 8/2018 |

(Continued)

OTHER PUBLICATIONS

Hunt et al., "Gravity refrigeration cycle: An efficient approach for refrigeration in mountainous regions", Sustainable Energy Technologies and Assessments 69 (2024) 103919, Jul. 26, 2024 (Year: 2024).*

*Primary Examiner* — Robert J Hoffberg
(74) *Attorney, Agent, or Firm* — DINSMORE & SHOHL LLP

(57) ABSTRACT

The present disclosure is directed to systems and methods for cooling electronic devices. The system comprises a pump, a distribution manifold fluidly coupled to the pump, one or more capillary coolers fluidly coupled to the distribution manifold, one or more electronic devices coupled to the one or more capillary coolers, a vapor line fluidly coupled to the one or more capillary coolers, and a condenser comprising an inlet and an outlet, wherein the inlet is fluidly coupled to the vapor line and the outlet is fluidly coupled to the pump.

14 Claims, 10 Drawing Sheets

(51) Int. Cl.
*F28D 15/04* (2006.01)
*H01L 23/427* (2006.01)

(52) U.S. Cl.
CPC .......... *F28D 15/043* (2013.01); *H01L 23/427* (2013.01); *H05K 7/20327* (2013.01); *H05K 7/20381* (2013.01); *H05K 7/20809* (2013.01); *H05K 7/20827* (2013.01); *H05K 7/20836* (2013.01)

(56) References Cited

U.S. PATENT DOCUMENTS

| | | | |
|---|---|---|---|
| 6,679,081 B2 * | 1/2004 | Marsala | H01L 23/473 |
| | | | 257/E23.098 |
| 7,957,132 B2 | 6/2011 | Fried | |
| 2005/0005623 A1 * | 1/2005 | Marsala | F25B 23/006 |
| | | | 257/E23.098 |
| 2009/0158757 A1 * | 6/2009 | Marsala | F25B 23/006 |
| | | | 62/529 |
| 2022/0039296 A1 | 2/2022 | Dupont | |
| 2022/0232739 A1 | 7/2022 | Heydari | |

FOREIGN PATENT DOCUMENTS

| | | |
|---|---|---|
| CN | 109496110 | 3/2019 |
| CN | 111050525 | 4/2020 |
| WO | 2015/054303 A1 | 4/2015 |

\* cited by examiner

SYSTEMS AND METHODS FOR COOLING ELECTRONIC DEVICES

BACKGROUND

Field

The present disclosure relates to systems and methods for cooling electronics.

Technical Background

Electronic devices can be housed in facilities such as data centers and arranged in various setups, such as vertical stacks. Such electronic devices require cooling to maintain the electronic devices at preferred operating temperature. Conventional cooling systems for electronic devices may pump a cooling fluid upward through the electronic devices, which may result in pressure loss as the fluid moves through the electronic devices. Further, such cooling systems can use a large amount of electricity in order to operate the pumps and keep the electronic devices at the preferred operating temperature.

SUMMARY

Electronic devices generate heat during operation. In order to operate effectively, electronic devices should be maintained within an ideal operating temperature range. Thus, electronic devices should be cooled. Electronic devices may be arranged in stacks inside facilities wherein the facility requires a large scale cooling system to maintain the electronic devices at a preferred operating temperature. Conventional large scale electronic device cooling systems may pump fluid upwards through vertical stacks of electronic devices. However, conventional cooling systems can result in large amounts of electricity needed to operate the pumps to move fluid vertically against the force of gravity. Further, conventional cooling systems can result in a pressure loss across the vertical stacks of electronic devices such that the electronic device at the top of the vertical stack receives a lower pressure of cooling fluid than the electronic device at the bottom of the vertical stack. This can result in an inefficient use of electricity to cool the electronic devices and uneven cooling of electronic devices across the vertical stacks of electronic devices. Therefore, there exists a need for a large scale cooling system which can more efficiently move fluid across the vertical stacks of electronic devices and can more evenly cool each electronic device in the vertical stack of electronic devices.

The present system can more efficiently use electricity to cool electronic devices by utilizing capillary coolers to flow a cooling fluid across electronic devices. Capillary coolers include one or more small diameter channels which may passively draw a fluid downward through the vertical stacks of electronic devices. The fluid may then pass through a condenser to cool the fluid. The fluid may then be pumped above the vertical stack of electronic devices so that the fluid may be passed through the capillary cooler again. This can provide the advantage of lower electricity demand because the pumps are not moving fluid under pressure through the electronic devices, but instead are moving fluid through an unpressurized or low pressure pipe, tube, or similar device, and the fluid is then passively drawn by the capillary coolers through the vertical stacks of electronic devices.

Embodiments generally include a pump, a distribution manifold wherein the distribution manifold is fluidly coupled to the pump, one or more capillary coolers fluidly coupled to the distribution manifold, one or more electronic devices coupled to the one or more capillary coolers, a vapor line fluidly coupled to the one or more capillary coolers, and a condenser fluidly coupled to the vapor line. The electronic devices may evaporate a fluid and the condenser may condense the fluid. The distribution manifold may be placed vertically above the one or more electronic devices and capillary coolers, such that gravity flows the fluid between the distribution manifold and the capillary coolers. The one or more electronic devices may be arranged in vertical stacks. In some embodiments, a valve may be placed between the distribution manifold and the one or more electronic devices. In some embodiments there may be a controller which is configured to monitor a characteristic of the one or more electronic devices and is further coupled to the pump and/or valve. In some embodiments, the system is arranged in a data center.

In one embodiment a system for cooling electronic devices includes a pump, a distribution manifold fluidly coupled to the pump, one or more capillary coolers fluidly coupled to the distribution manifold, one or more electronic devices coupled to the one or more capillary coolers, a vapor line fluidly coupled to the one or more capillary coolers, and a condenser comprising an inlet and an outlet, wherein the inlet is fluidly coupled to the vapor line and the outlet is fluidly coupled to the pump.

In another embodiment a method for cooling electronic devices, the method includes the steps of moving a fluid by a pump towards a distribution manifold fluidly coupled to the pump, wherein the distribution manifold is placed above one or more electronic devices, distributing the fluid with the distribution manifold to one more capillary coolers, flowing fluid through the one or more electronic devices with the one or more capillary coolers, and cooling fluid with a condenser.

In yet another embodiment a data center includes a system for cooling electronic devices, the system including a pump, a distribution manifold fluidly coupled to the pump, wherein the distribution manifold is placed vertically above one or more capillary coolers and the one or more capillary coolers are fluidly coupled to the distribution manifold, one or more electronic devices coupled to the one or more capillary coolers, a vapor line fluidly coupled to the one or more capillary coolers, and a condenser comprising an inlet and an outlet, wherein the inlet is fluidly coupled to the vapor line and the outlet is fluidly coupled to the pump.

Additional features and advantages of the technology described in this disclosure will be set forth in the detailed description which follows, and in part will be readily apparent to those skilled in the art from the description or recognized by practicing the technology as described in this disclosure, including the detailed description which follows, the claims, as well as the appended drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments disclosed herein include systems and methods for cooling electronic devices. Electronic devices generate heat during operation. Electronic devices may be arranged in groups of electronic devices in facilities such as server buildings or data centers. Such facilities require cooling systems in order to maintain the electronic devices at a preferred operating temperature. Conventional cooling systems can use a large amount of power in order to maintain the electronic devices at the preferred operating temperature, and can result in pressure loss along the electronic devices as pumps force a cooling fluid along the electronic devices.

The systems and methods address the above issues by moving fluid above the electronic devices and allowing the fluid to be moved by gravity though a series of capillary coolers. As will be described in greater detail herein, the systems and methods include a pump which can move fluid upwards into a fluid distribution manifold which may distribute the fluid to one or more capillary coolers. The capillary coolers may be arranged such that fluid may flow downwards along the capillary cooler by the force of gravity. The capillary cooler may be coupled to one or more of the electronic devices, such that fluid may flow across the one or more electronic devices in order to cool the one or more electronic devices.

The term "evaporator" refers to the portion of the system where liquid is converted from a liquid to a gas, absorbing heat. The term "condenser" refers to the portion of the system where gas is converted from a gas to a liquid, releasing heat.

Conventional cooling systems may pump a fluid upward through vertical stacks of electronic devices. This may use a large amount of electricity and may have a pressure drop of the fluid as it moves upward along the vertical stack of electronic devices. Embodiments can more efficiently use electricity to cool vertical stacks of electronic devices by pumping the cooling fluid up a low pressure pipe or tube separate from the vertical stack of electronic devices, and allowing the fluid to flow across the vertical stacks of electronic devices by the fluid being passively drawn by capillary coolers coupled to the vertical stacks of electronic devices. The present system can further reduce electricity usage by cooling the condenser of the system by geothermal cooling or passive radiative cooling.

Figure 1:
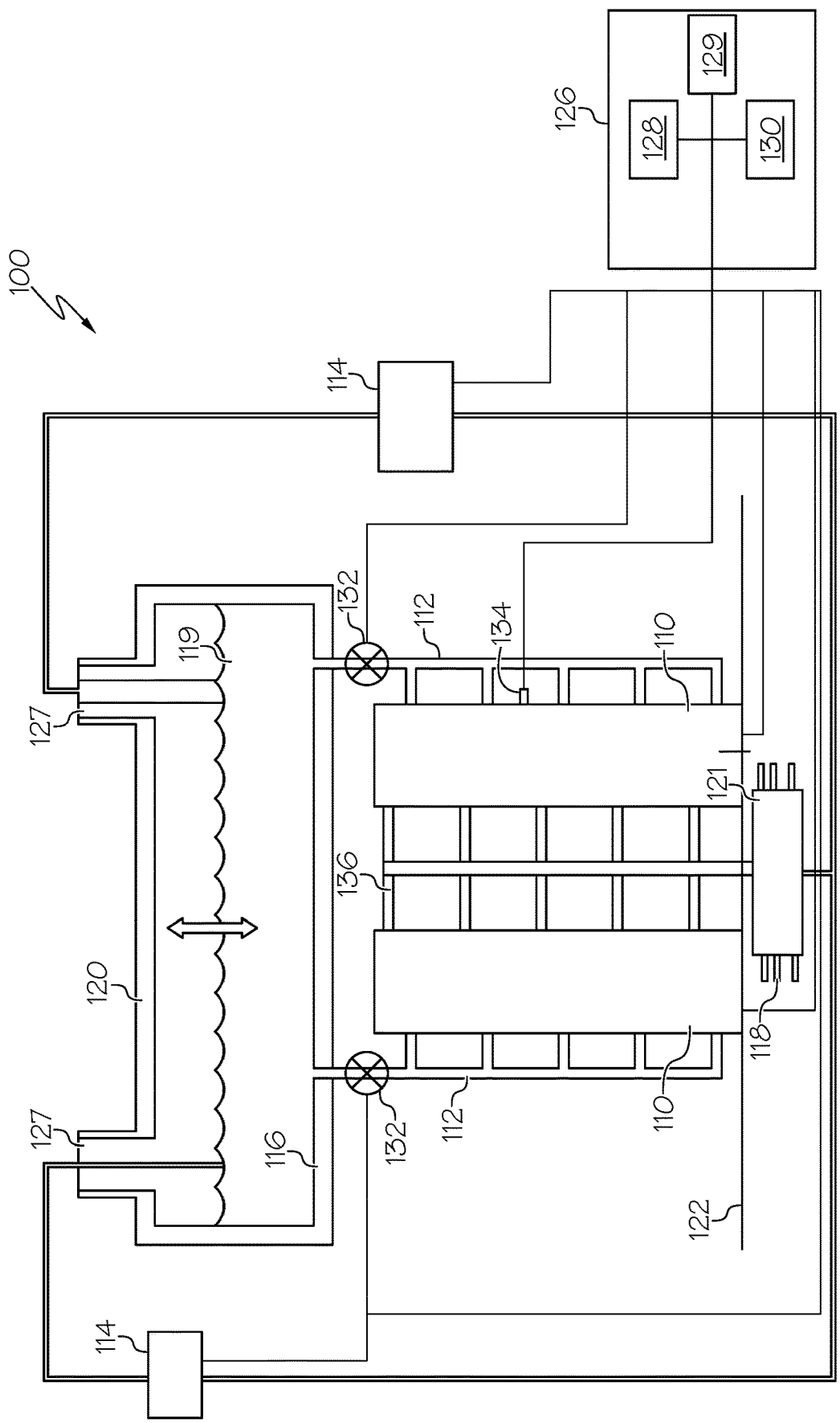
FIG. 1 schematically depicts a system for cooling electronic devices according to one or more embodiments shown and described herein.

Referring now to FIG. 1, an example embodiment of the system 100 is shown. The system 100 includes one or more pumps 114. The one or more pumps 114 may be a positive-displacement pump, centrifugal pump, axial-flow pump, or any other suitable type of pump. Note that while two pumps 114 are shown in FIG. 1, any number of pumps can be used, such as one pump, three pumps, five pumps, ten pumps, or any other number of pumps. The pumps 114 are fluidly coupled to one or more inlets 127 of a fluid reservoir 120. The pumps 114 may be configured to move fluid 119 to the fluid reservoir 120. The fluid reservoir 120 may house a fluid 119. The fluid 119 may be water, glycol-water solutions, dielectric fluid, or any other fluid suitable for cooling electronic devices. The fluid reservoir 120 may be of any suitable shape, such as a cylinder or a rectangular prism. In some embodiments, the fluid reservoir 120 may funnel the fluid 119 towards the bottom of the fluid reservoir 120, such as by a tapered or funnel-like shape. The fluid reservoir 120 may be fluidly coupled to a distribution manifold 116. Fluid 119 may flow from the fluid reservoir 120 to the distribution manifold 116 by the force of gravity. The distribution manifold 116 distributes the fluid 119 to one or more electronic devices 110. The distribution manifold 116 may have a series of runners and/or orifices to allow the fluid 119 to flow to the one or more electronic devices 110. There may be one or more valves 132 fluidly coupled to the distribution manifold 116 and the one or more electronic devices 110 where the one or more valves 132 are placed between the distribution manifold 116 and the one or more electronic devices 110. In this embodiment, two valves 132 are shown, but any number of valves 132 can be used, such as one valve, three valves, five valves, ten valves, or any other number of valves. The one or more valves 132 may be configured with a manual knob such that an operator may manually open and close the valve 132. The one or more valves 132 may further be configured with a stepper motor or other similar electronic device such that an electronic signal can cause the valve 132 to open and close. The valve 132 further may be partially opened such that a desired amount of fluid 119 may flow to the capillary coolers 112.

The distribution manifold 116 is further fluidly coupled to the one or more capillary coolers 112. The capillary coolers 112 are coupled to the one or more electronic devices 110, such that the fluid 119 cools the electronic devices 110. The one or more electronic devices 110 may be integrated circuit device such as CPUs, GPUs, or any other electronic devices that may require cooling. The one or more electronic devices 110 may be arranged in vertical stacks. Each vertical stack may have any number of electronic devices 110. The system 100 may include any number of vertical stacks of electronic devices 110. The capillary coolers 112 may be of any suitable cross-sectional shape, including but not limited to a circular cross-section, a rectangular cross-section, or any other suitable shape. The capillary coolers 112 may further have any suitable cross-sectional diameter, including but not limited to 0.1 millimeters, 0.5 millimeters, 1 millimeter, 5 millimeters, 10 millimeters, or any other suitable cross-sectional diameter. The capillary coolers 112 may be appropriately sized so as to allow the fluid 119 to be drawn through the capillary coolers 112 and pass to the one or more electronic devices 110, such that the fluid 119 removes heat from the electronic devices 110 and the fluid 119 is evaporated.

The capillary cooler 112 is coupled to a vapor line 136, where the vapor line 136 is placed downstream of the one or more electronic devices 110. As shown in FIG. 1, multiple capillary coolers 112 are fluidly coupled to a single vapor line 136. It is to be understood that there may be any number of vapor lines 136, such as one vapor line 136 per one capillary cooler 112. The vapor line 136 is fluidly coupled to the inlet 121 of a condenser 118. The fluid 119 is condensed in the condenser 118. The condenser 118 may be placed below a floor 122 of a facility. The facility may be for example a server room or a data center. The condenser 118 may be cooled by any appropriate cooling system, including but not limited to geothermal cooling wherein a condenser cooling fluid from the geothermal system is moved from below the ground underneath the facility and the condenser cooling fluid from the geothermal system is passed across the condenser 118 to cool the fluid 119 passing through the condenser 118. The condenser 118 may also be cooled by radiative cooling wherein condenser cooling fluid is moved across a radiative cooling panel which may be a panel of high solar reflectance and with a high thermal radiation heat transfer rate such that the condenser cooling fluid is cooled, and the condenser cooling fluid is then passed across the condenser 118. The condenser 118 may also be cooled by the HVAC system of the facility, wherein cooled air from a conventional air conditioning system may be moved across the condenser 118. The condenser 118 may also be cooled by any other appropriate cooling mechanism. The outlet 123 of the condenser 118 is fluidly coupled to the one or more pumps 114, such that after the fluid 119 is condensed in the condenser 118 the fluid may again be moved by the pump 114 to the fluid reservoir 120.

The system 100 further may include a controller 126 which includes a processor 128, a user interface 129, and a non-transitory, processor-readable storage medium 130. The system 100 further may include a temperature sensor 134. The temperature sensor 134 may be coupled to the one or more electronic devices 110. While a single temperature sensor 134 is shown, it should be understood that any number of temperature sensors 134 may be included. In some embodiments there may be a temperature sensor 134 coupled to each electronic device 110. In some embodiments, there may be a plurality of temperature sensors 134 coupled to each electronic device 110 such that the plurality of temperature sensors 134 may monitor the temperature of the electronic device 110 in multiple places across the electronic device 110. The temperature sensor 134 further is coupled to the controller 126. The temperature sensor 134 may generate an electronic signal corresponding to the detected temperature of the electronic device 110. The temperature sensor 134 may transmit the electronic signal to the controller 126. The controller 126 may compare the electronic signal corresponding to the detected temperature to a threshold temperature stored on the non-transitory, processor-readable storage medium 130. The non-transitory, processor-readable storage medium 130 may also be referred to as the memory of the controller 126. The controller 126 may be coupled to the one or more pumps 114 and the controller 126 may be coupled to the one or more valves 132. If the detected temperature exceeds the threshold temperature, the processor 128 of the controller 126 may send a signal to the pump 114 to activate the pump 114 and pump fluid to the fluid reservoir 120. In some embodiments, the pump 114 may be a variable speed pump. The controller 126 may vary the speed of the pump 114 in response to the electronic signal corresponding to the detected temperature in order to more precisely control the flow of the fluid 119 to maintain the electronic devices 110 at a preferred operating temperature. The controller 126 further may deactivate the pump 114 if fluid is no longer needed at the electronic devices 110.

Further, if the detected temperature exceeds the threshold temperature, the processor 128 of the controller 126 may send a signal to the valve 132 to open a prescribed amount and allow fluid to flow into the capillary cooler 112. The valve 132 may be coupled to a stepper motor or other suitable mechanism that may open the valve at various opening positions. For example, the controller 126 may send a signal to the stepper motor coupled to the valve 132 to open the valve to a first position at 10-percent open, a second position at 25-percent open, a third position at 50-percent open, a fourth position at 100-percent open, or any other position corresponding to any other percentage open in order to precisely control the flow of the fluid 119 to maintain the electronic devices 110 at a preferred operating temperature.

In another embodiment, an operator may enter a specified temperature into the user interface 129 of the controller 126. The user interface 129 may be for example a touch screen, a keypad, a mobile computing device, or any other suitable user interface. The controller 126 may store the specified temperature in the non-transitory, processor-readable storage medium 130. If the detected temperature exceeds the specified temperature, the processor 128 of the controller 126 may send a signal to the pump 114 to pump fluid to the fluid reservoir 120, or the controller 126 may send a signal to the valve 132 to open the valve 132 a prescribed amount and allow fluid 119 to flow into the capillary cooler 112.

The controller 126 may also be coupled to the electronic devices 110. The controller 126 may be configured to monitor the power consumption level of the electronic devices 110, such that the electronic device 110 transmits an electronic signal corresponding to the power consumption level of the electronic device 110. The controller 126 may compare the electronic signal corresponding to the power consumption level to a threshold power consumption level stored on the non-transitory, processor-readable storage medium 130. If the detected power consumption level exceeds the threshold power consumption, the processor 128 of the controller 126 may send a signal to the pump 114 to move fluid to the fluid reservoir 120. In some embodiments, the pump 114 may be a variable speed pump. The controller 126 may vary the speed of the pump 114 in response to the electronic signal corresponding to the detected power consumption level in order to more precisely control the flow of the fluid 119 in response to the detected power consumption level.

Further, if the detected power consumption level exceeds the threshold power consumption level, the processor 128 of the controller 126 may send a signal to the valve 132 to open a prescribed amount and allow fluid to flow into the capillary cooler 112. The valve 132 may be coupled to a stepper motor or other suitable mechanism that may open the valve at various opening positions. For example, the controller 126 may send a signal to the stepper motor of the valve 132 to open the valve 132 to a first position at 10-percent open, a second position at 25-percent open, a third position at 50-percent open, a fourth position at 100-percent open, or any other percentage open in order to more precisely control the flow of the fluid 119 in response to the detected power consumption level.

In another embodiment, an operator may enter a specified power consumption level into the user interface 129 of the controller 126. The controller 126 may store the specified power consumption level in the non-transitory, processor-readable storage medium 130. If the detected power consumption level exceeds the specified temperature, the processor 128 of the controller 126 may send a signal to the pump 114 to move fluid to the fluid reservoir 120, or the controller 126 may send a signal to the valve 132 to open a prescribed amount and allow fluid 119 to flow into the capillary cooler 112.

The system 100 may be arranged in any suitable environment. In one embodiment, the system 100 is arranged to cool electronic devices 110 placed in a data center. The data center may be a facility which houses a large number of vertical stacks of electronic devices 110 in one or more rooms. In other embodiments, the data center may house a small number of vertical stacks of electronic devices 110. In yet further embodiments, the data center may house a single electronic device 110.

Figure 2:
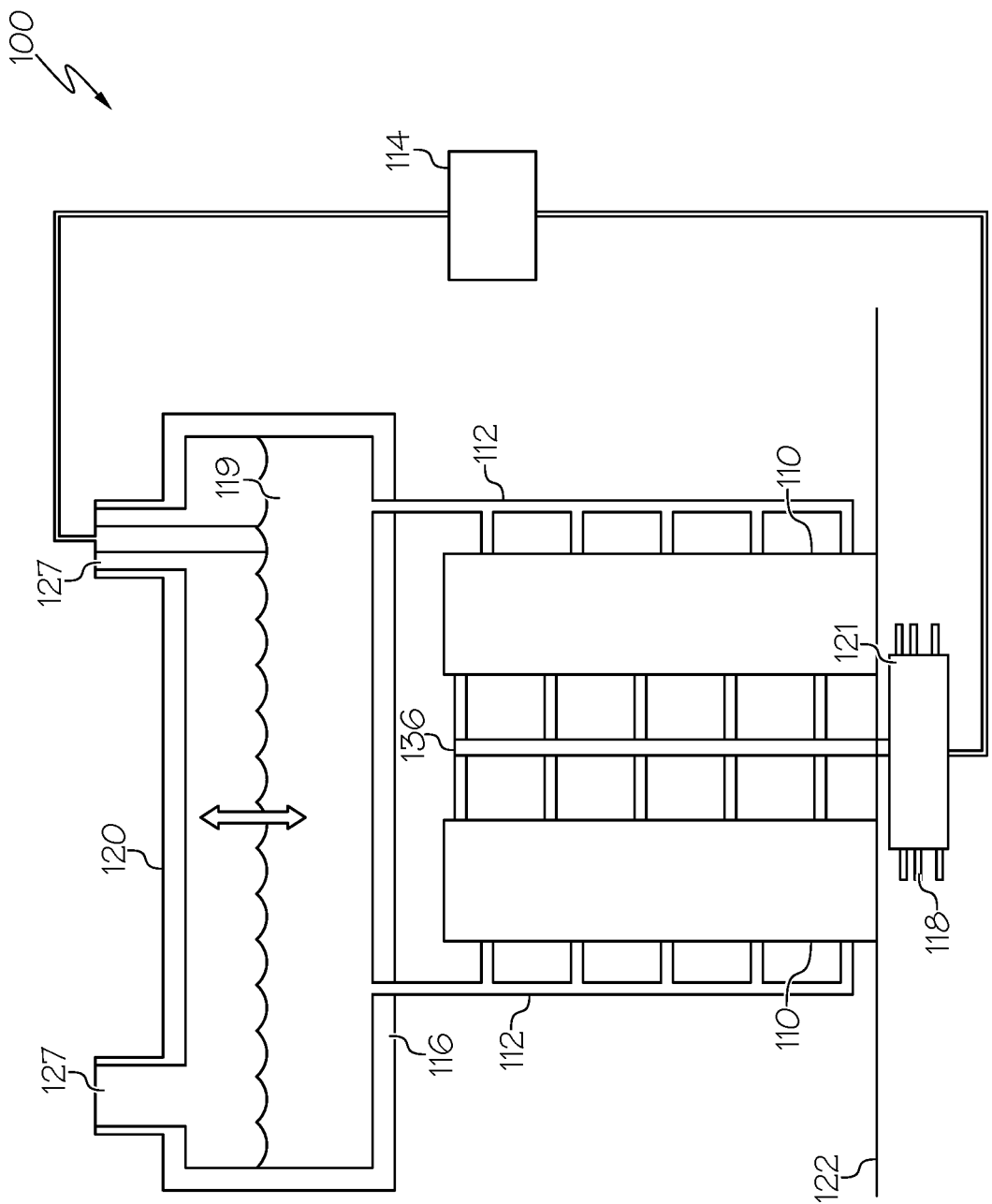
FIG. 2 schematically depicts a system for cooling electronic devices according to one or more embodiments shown and described herein.

Referring now to FIG. 2, another embodiment of the system 100 is shown. A single pump 114 may pump fluid into the fluid reservoir 120. The fluid reservoir 120 may have an inlet 127 which is open to atmosphere, such that the fluid 119 in the fluid reservoir 120 may be at atmospheric pressure. The atmospheric pressure of the fluid 119 may assist in the one or more capillary coolers 112 passively drawing fluid 119 from the fluid reservoir 120.

Figure 3:
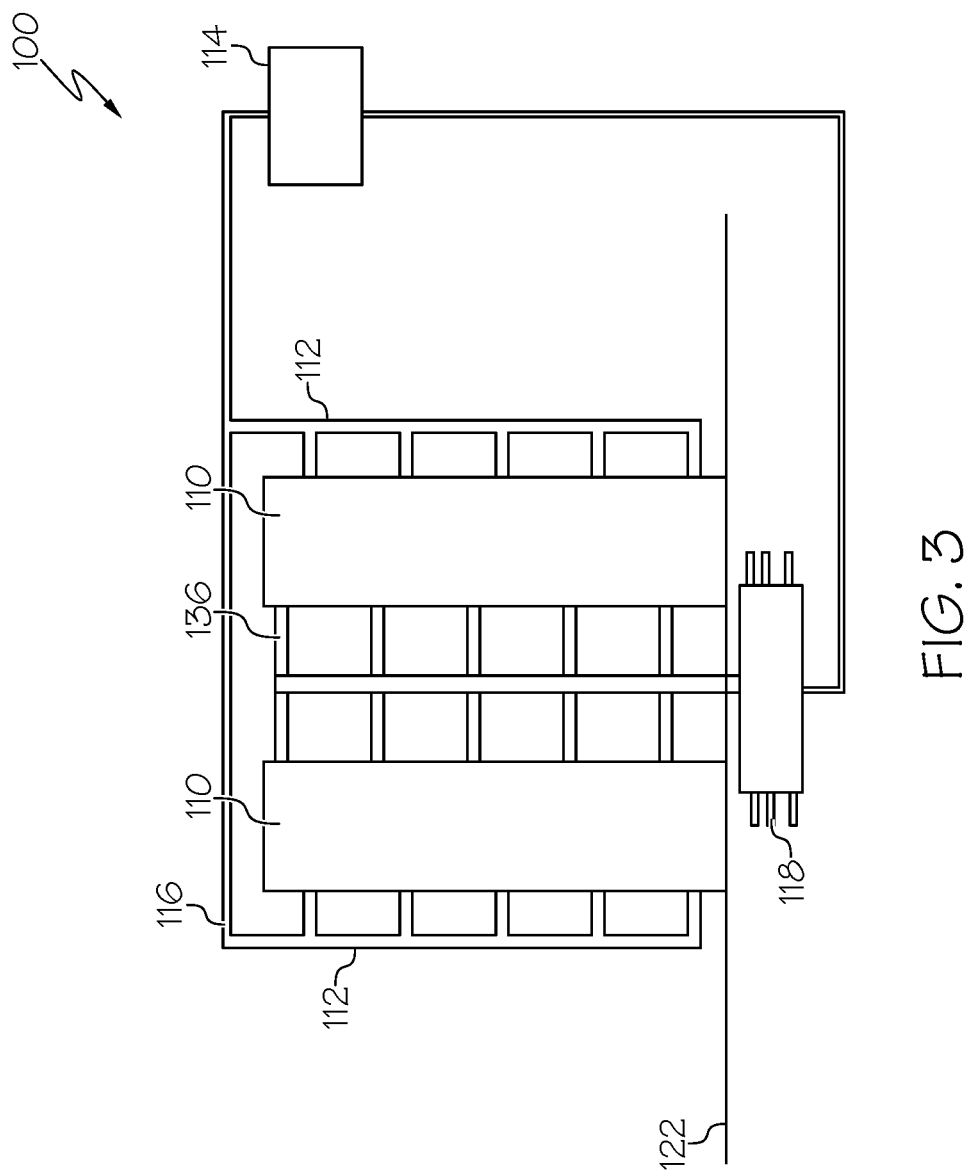
FIG. 3 schematically depicts a system for cooling electronic devices according to one or more embodiments shown and described herein.

Referring now to FIG. 3, another embodiment of the system 100 is shown. The pump 114 may be fluidly coupled to the distribution manifold 116. The distribution manifold 116 maintains a volume of fluid 119 above the one or more capillary coolers 112, such that the volume of fluid 119 maintains a pressure head above the one or more capillary coolers within the distribution manifold 116. The system 100 includes a single pump 114.

Figure 4:
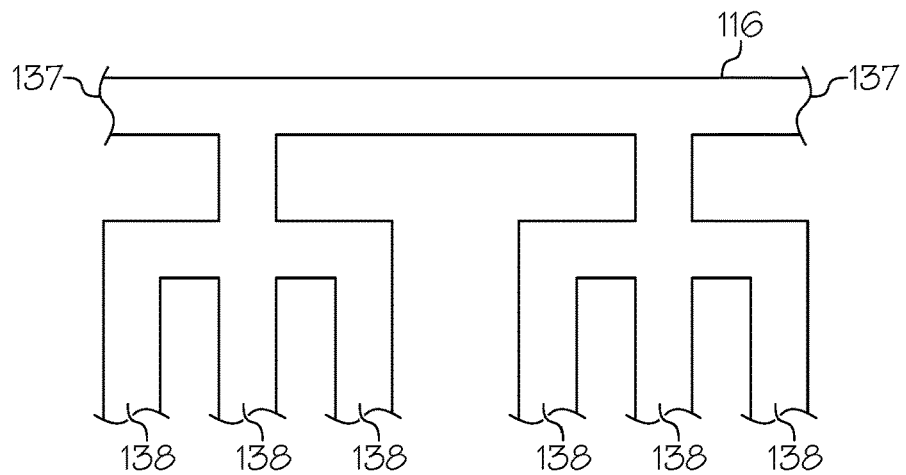
FIG. 4 schematically depicts a distribution manifold according to one or more embodiments shown and described herein.

Referring now to FIG. 4, an embodiment of the distribution manifold 116 is shown. In the embodiment shown, the distribution manifold 116 includes two inlets 137, which are fluidly coupled to one or more pumps 114 (not shown). It is to be understood that the distribution manifold 116 may include any number of inlets 137, including but not limited to one inlet 137, three inlets 137, five inlets 137, ten inlets 137, or any other suitable number of inlets 137. In the embodiment shown, the distribution manifold 116 further includes six outlets 138 which are fluidly coupled to one or more capillary coolers 112. It is to be understood that the distribution manifold 116 may include any number of outlets 138, including but not limited to one outlet 138, five outlets 138, ten outlets 138, twenty outlets 138, or any other suitable number of outlets 138. The distribution manifold may be any suitable cross-sectional shape, including but not limited to circular, rectangular, or any other suitable shape.

Figure 5:
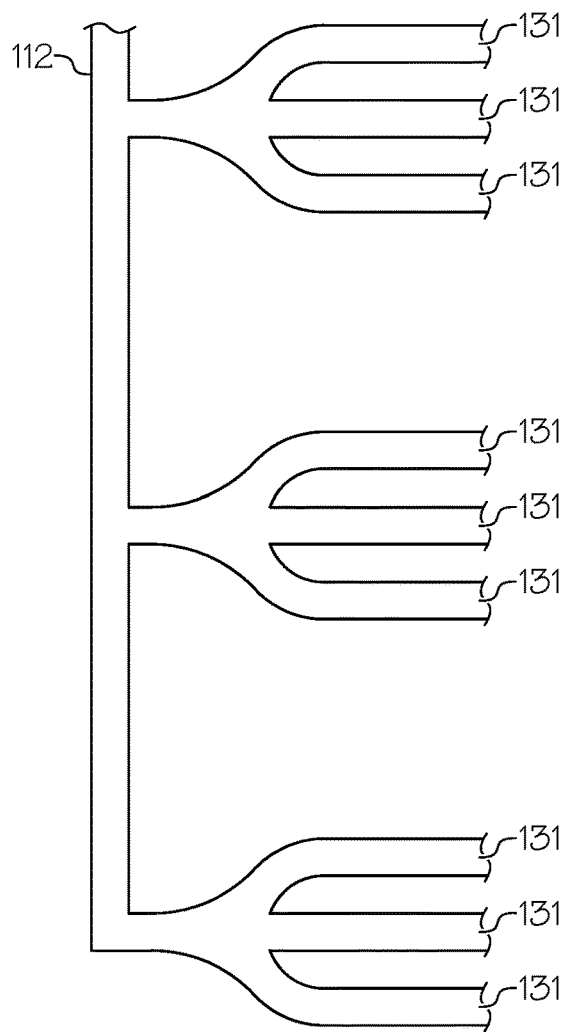
FIG. 5 schematically depicts a capillary cooler according to one or more embodiments shown and described herein.

Referring now to FIG. 5, an embodiment of the capillary cooler 112 is shown. In the embodiment shown, the capillary cooler 112 may include six capillary tubes 131. It is to be understood that each capillary cooler 112 may include any number of capillary tubes 131, including but not limited to one capillary tube 131, five capillary tubes 131, ten capillary tubes 131, twenty capillary tubes 131, or any other suitable number of capillary tubes 131. In some embodiments, each capillary tube 131 may be coupled to a single electronic device 110. In further embodiments, a plurality of capillary tubes 131 may be coupled to a single electronic device 110. In yet further embodiments, a single capillary tube 131 may be coupled to a plurality of electronic devices 110.

Figure 6:
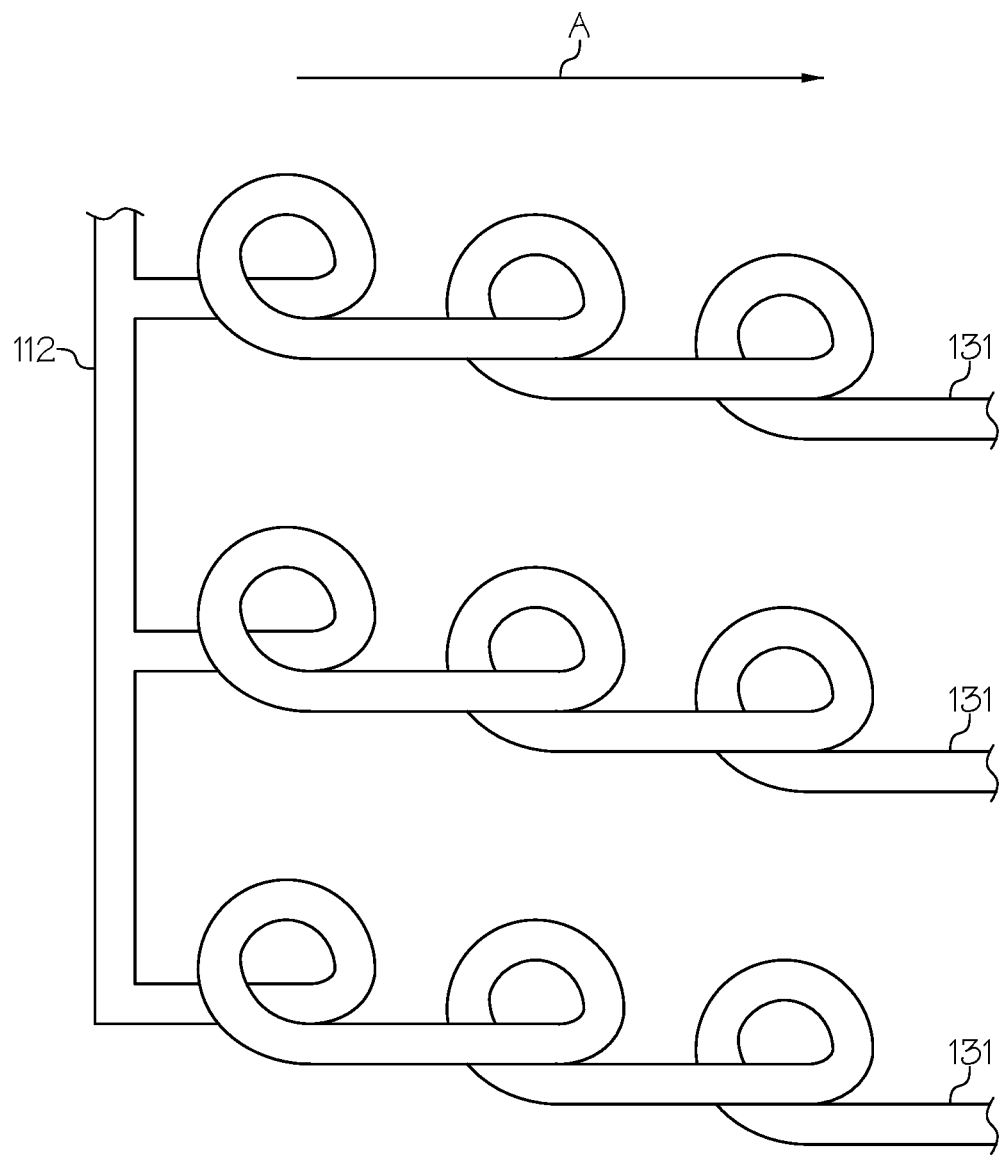
FIG. 6 schematically depicts a capillary cooler according to one or more embodiments shown and described herein.

Referring now to FIG. 6, an embodiment of the capillary cooler 112 is shown. In the embodiment shown, the capillary tubes 131 are in a spiral formation. The force of gravity is indicated by arrow A. The spiral formation allows for control of fluid flow in the capillary tube 131, wherein the spiral formation acts as a flow resistance gate (or passive valve) to moderate fluid delivery to the electronic device 110 in the direction of gravity when compared to a straight capillary tube 131. Further, the spiral formation allows for increased cooling of the electronic device 110 when compared to a straight capillary tube 131.

Figure 7:
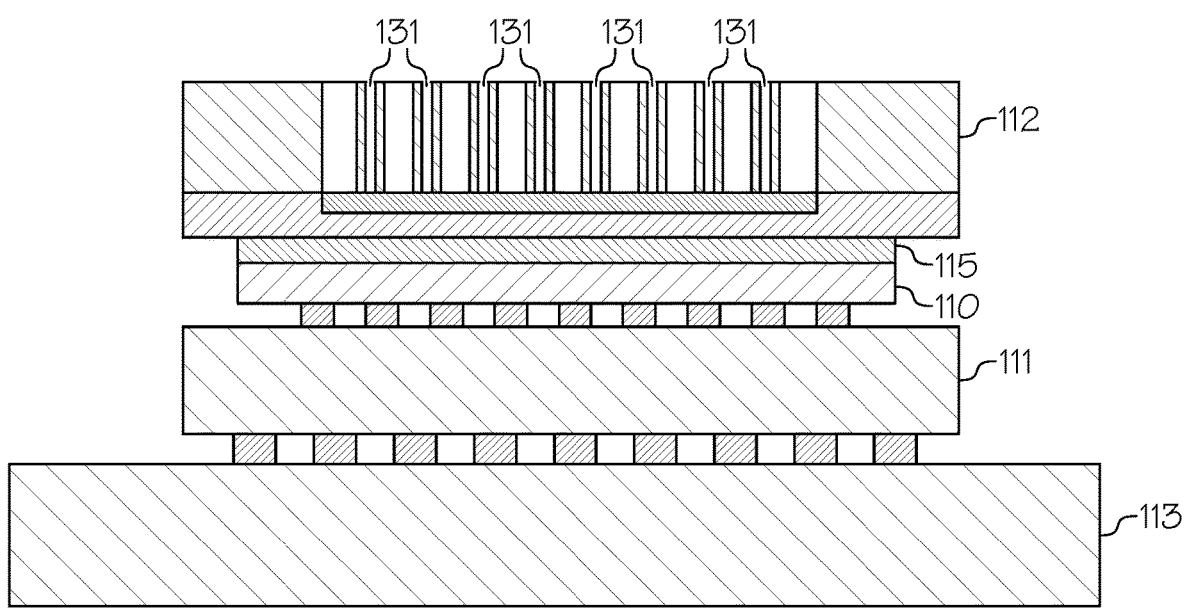
FIG. 7 schematically depicts a capillary cooler coupled to an electronic device according to one or more embodiments shown and described herein.

Referring now to FIG. 7, an embodiment of a coupling of the capillary cooler 112 to the electronic device 110 is shown. The capillary cooler 112 includes one or more capillary tubes 131. The electronic device 110 is shown mounted on a printed circuit board (PCB) 113, wherein the electronic device 110 is mounted via an interposer 111. A thermal interface material 115 may be placed between the electronic device 110 and the capillary cooler 112, so that there may better thermal transfer between the electronic device 110 and the capillary cooler 112. The thermal interface material 115 may be for example a thermal paste, or any other suitable thermal interface material. Any number of capillary tubes 131 may be coupled to the electronic device 110 via the thermal interface material 115.

Figure 8:
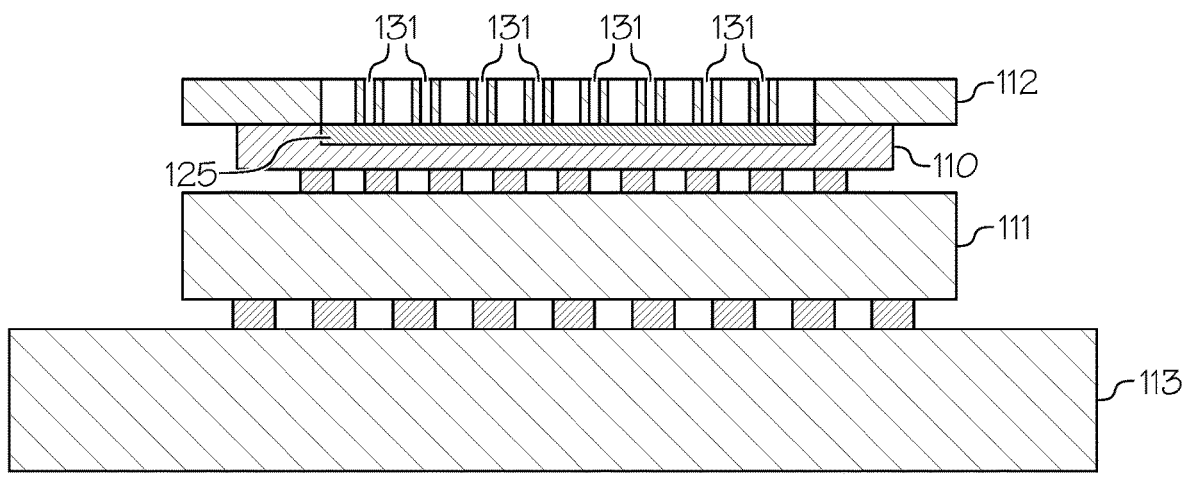
FIG. 8 schematically depicts a capillary coolers coupled to an electronic device according to one or more embodiments shown and described herein.

Referring now to FIG. 8 another embodiment of a coupling of the capillary cooler 112 to the electronic device 110 is shown. The electronic device 110 is shown mounted on a printed circuit board (PCB) 113, wherein the electronic device 110 is mounted via an interposer 111. A wick 125 may be placed between the capillary tubes 131 and the electronic device 110. The wick 125 may draw fluid 119 toward the surface of the capillary tubes 131 to more efficiently transfer heat from the electronic device 110 to the fluid 119. The wick 125 may be composed of any suitable materials, including but not limited to sintered metal particles such as copper or nickel, deposited fabrics such as cotton, deposited ceramics such as aluminum oxide, or any other suitable wick material. In some embodiments, the wick 125 may be additively printed on to the electronic device 110 or an intermediate substrate (not shown). The wick 125 may be a composite comprising two or more materials arranged in a functional manner.

Figure 9:
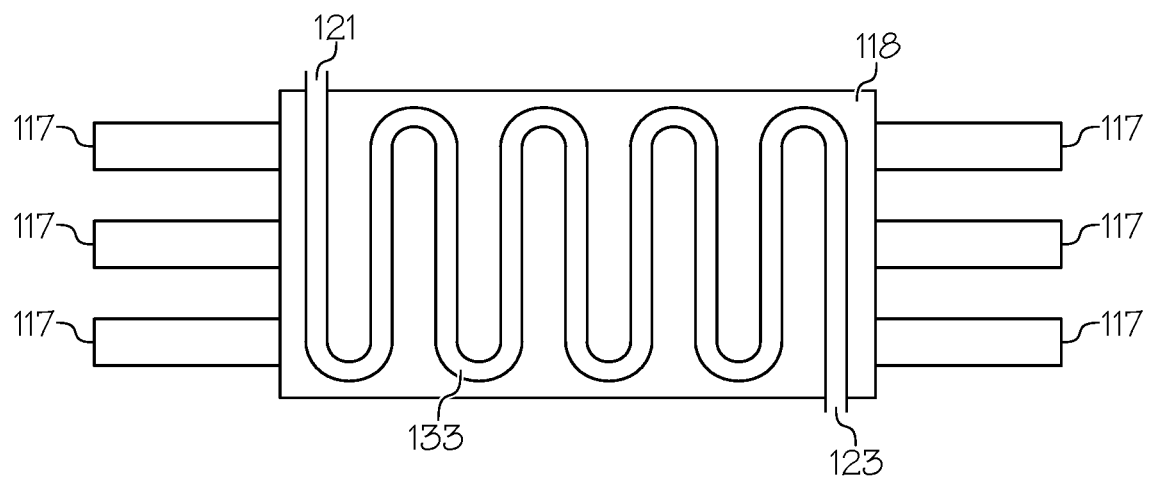
FIG. 9 schematically depicts a condenser according to one or more embodiments shown and described herein.

Referring now to FIG. 9, a sectional view of an embodiment of the condenser 118 is shown. The condenser 118 may include an inlet 121 and an outlet 123. The condenser inlet 121 may be fluidly coupled to the vapor line 136 (not shown), and the condenser outlet 123 may be fluidly coupled to the one or more pumps 114 (not shown). The condenser may have one or more fins 117. The fins 117 may allow for heat from the fluid 119 to be dissipated more efficiently compared to a condenser without fins. The condenser 118 may include a channel 133 to allow the fluid 119 to flow from the condenser inlet 121 to the condenser outlet 123.

Figure 10:
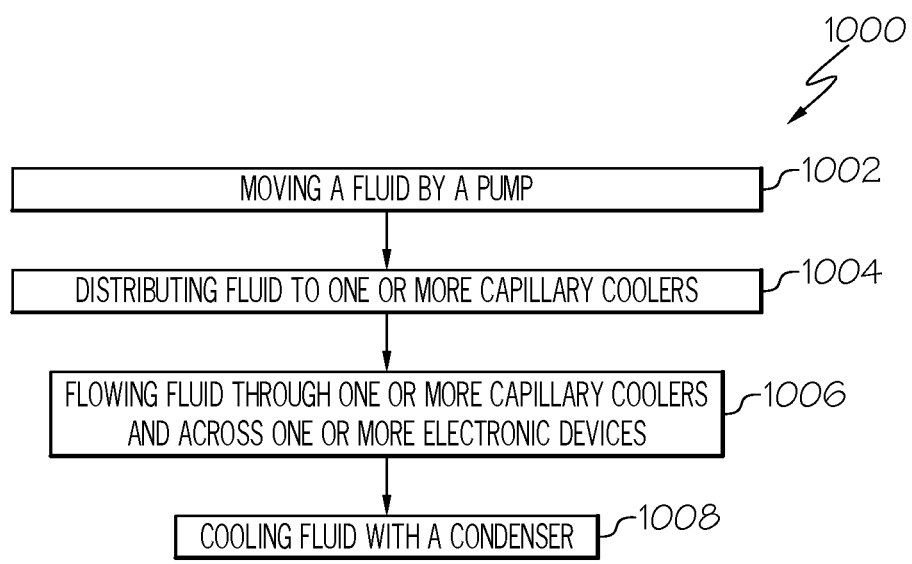
FIG. 10 schematically depicts a flowchart of an illustrative method for cooling electronic devices.

Referring now to FIG. 10, the steps of a method for cooling electronics is described. With reference to FIGS. 1-7, at block 1002, the method 1000 includes moving the fluid 119 by the one or more pumps 114. At block 1004, the method 1000 includes distributing the fluid 119 to one or more capillary coolers 112. That is, the fluid 119 may be distributed to one or more capillary coolers 112 with the distribution manifold 116. At block 1006, the method 1000 includes flowing the fluid 119 through one or more capillary coolers 112 which is coupled to one or more electronic devices 110. That is, the fluid 119 may be passively drawn from the distribution manifold 116 by the one or more capillary coolers 112 such that the fluid flows through the one or more capillary coolers 112 and across the one or more electronic devices 110. At block 1008, the method 1000 includes cooling the fluid 119 with the condenser 118.

Figure 11:
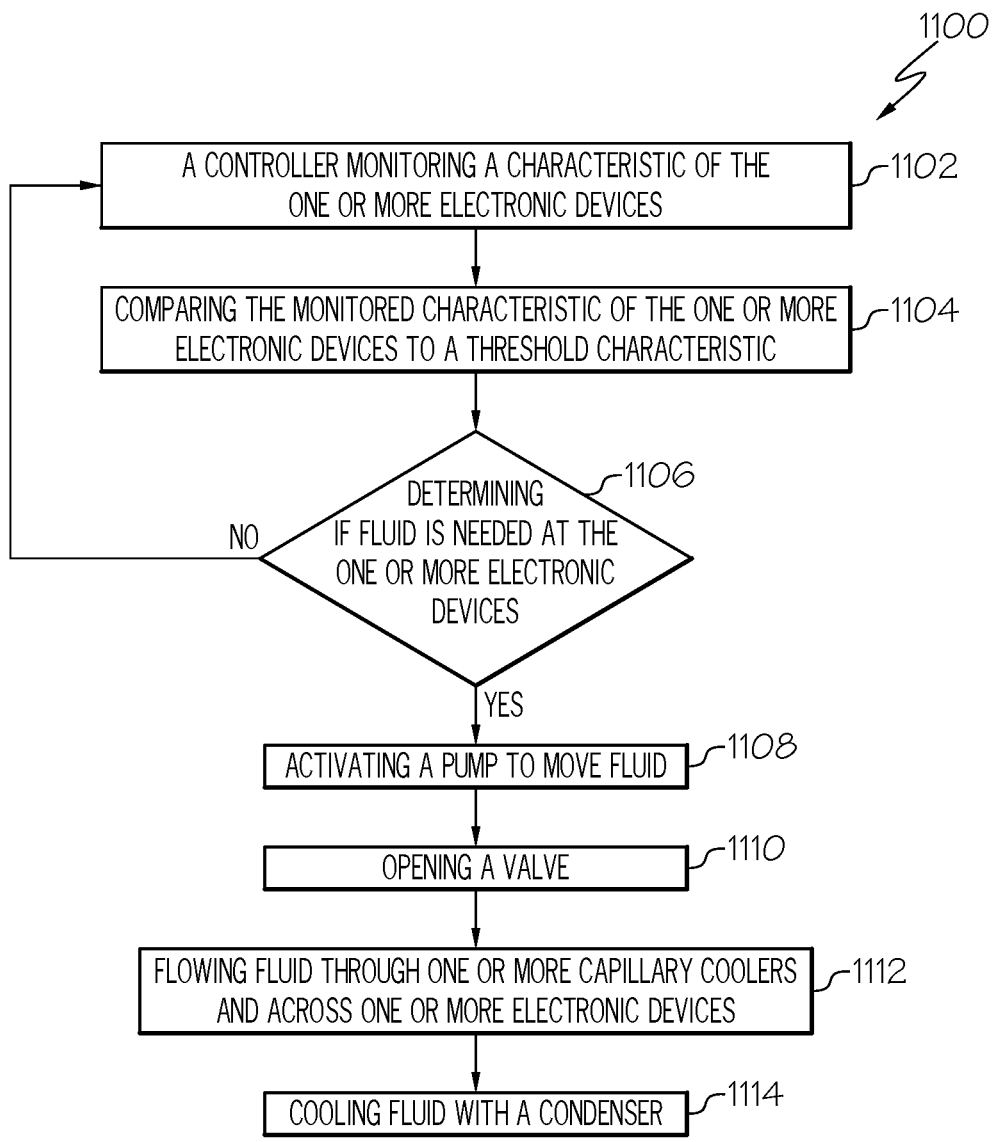
FIG. 11 schematically depicts another flowchart of an illustrative method for cooling electronic devices.

Referring now to FIG. 11, the steps of a method for cooling electronics is described. With reference to FIGS.

1-7, at block 1102, the method 1100 includes the controller 126 monitoring a characteristic of the one or more electronic devices 110. The characteristic may be a power consumption level of the electronic devices 110, wherein the controller 126 is coupled to the electronic device 110. The characteristic may also be a temperature of the electronic device 110, wherein there is a temperature sensor 134 mounted to the electronic device 110 and the temperature sensor 134 is coupled to the controller 126. At block 1104, the method 1100 includes the controller 126 comparing the monitored characteristic of the electronic device 110 to a threshold characteristic. That is, a threshold characteristic may be stored on the non-transitory, processor-readable storage medium 130 and the controller 126 may compare the monitored characteristic to the stored threshold characteristic. The characteristic may be a temperature of an electrical consumption level. At block 1106, the method 1100 includes determining if fluid 119 is needed at the one or more electronic devices 110 based on the outcome of comparing the monitored characteristic of the electronic device 110 with the threshold characteristic. For example, if the monitored characteristic of the electronic device 110 is greater than the threshold characteristic, the controller 126 may determine that fluid is needed at the electronic device 110. If it is determined that fluid is needed at the one or more electronic devices 110 (block 1106="YES"), the method proceeds to the step described at block 1108. If it is determined that fluid is not needed at the one or more electronic devices 110 (block 1106="NO"), the method proceeds to the step described at block 1102. At block 1108, the method 1100 includes activating a pump 114 to move fluid 119. That is, the pump 114 may receive a signal from the controller 126 for the pump 114 to move fluid 119 to the fluid reservoir 120 or the distribution manifold 116. At block 1110, the method 1100 includes opening a valve 132. That is, the valve 132 my receive a signal from the controller 126 for the valve 132 to open such that fluid 119 may flow from the distribution manifold 116 to the capillary cooler 112. At block 1112, the method 1100 includes flowing the fluid 119 through the one or more capillary coolers 112 and across the one or more electronic devices 110. At block 1114, the method 1100 includes cooling the fluid 119 with the condenser 118.

Accordingly, a need exists for an electrically-efficient cooling system for cooling electronic devices. The system includes at least one pump. The pump is fluidly coupled to a fluid distribution manifold. The fluid distribution manifold is fluidly coupled to a capillary cooler. The capillary cooler can passively draw fluid from the fluid distribution manifold across one or more electronic devices. The electronic devices may evaporate the fluid. A vapor line is fluidly coupled to the capillary cooler wherein the evaporated fluid may flow through the vapor line. The vapor line is fluidly coupled to a condenser which may condense the vapor into a liquid. The condenser is fluidly coupled to the pump so the liquid may be pumped back to the fluid distribution manifold.

It may be noted that one or more of the following claims utilize the terms "where," "wherein," or "in which" as transitional phrases. For the purposes of defining the present technology, it may be noted that these terms are introduced in the claims as an open-ended transitional phrase that are used to introduce a recitation of a series of characteristics of the structure and should be interpreted in like manner as the more commonly used open-ended preamble term "comprising."

It should be understood that any two quantitative values assigned to a property may constitute a range of that property, and all combinations of ranges formed from all stated quantitative values of a given property are contemplated in this disclosure.

Having described the subject matter of the present disclosure in detail and by reference to specific embodiments, it may be noted that the various details described in this disclosure should not be taken to imply that these details relate to elements that are essential components of the various embodiments described in this disclosure, even in casings where a particular element may be illustrated in each of the drawings that accompany the present description. Rather, the claims appended hereto should be taken as the sole representation of the breadth of the present disclosure and the corresponding scope of the various embodiments described in this disclosure. Further, it will be apparent that modifications and variations are possible without departing from the scope of the appended claims.

What is claimed is:

1. A system for cooling electronic devices, the system comprising:
    a pump;
    a distribution manifold fluidly coupled to the pump, wherein the distribution manifold is placed vertically above one or more capillary coolers and the one or more capillary coolers are fluidly coupled to the distribution manifold;
    one or more of the electronic devices coupled to the one or more capillary coolers;
    a vapor line fluidly coupled to the one or more capillary coolers; and
    a condenser comprising an inlet and an outlet, wherein the inlet is fluidly coupled to the vapor line and the outlet is fluidly coupled to the pump.

2. The system of claim 1, wherein the distribution manifold comprises a fluid reservoir.

3. The system of claim 1, wherein the system is arranged in a data center.

4. The system of claim 1, further comprising a valve fluidly coupled to the distribution manifold and the one or more capillary coolers.

5. The system of claim 4, further comprising a controller operable to open and close the valve.

6. The system of claim 5, further comprising a temperature sensor, wherein the temperature sensor is arranged to monitor a temperature of the one or more electronic devices and the temperature sensor is coupled to the controller.

7. The system of claim 5, wherein the controller is coupled to the one or more electronic devices, and wherein the controller is arranged to monitor a power consumption level of the one or more electronic devices.

8. The system of claim 1, further comprising a controller operable to activate and deactivate the pump.

9. A data center comprising:
    a system for cooling electronic devices, the system comprising:
    a pump;
    a distribution manifold fluidly coupled to the pump, wherein the distribution manifold is placed vertically above one or more capillary coolers and the one or more capillary coolers are fluidly coupled to the distribution manifold;
    one or more of the electronic devices coupled to the one or more capillary coolers;
    a vapor line fluidly coupled to the one or more capillary coolers; and a condenser comprising an inlet and an outlet, wherein the inlet is fluidly coupled to the vapor line and the outlet is fluidly coupled to the pump.

10. The system of claim 9, further comprising a valve fluidly coupled to the distribution manifold and the one or more capillary coolers.

11. The system of claim 10, further comprising a controller operable to open and close the valve.

12. The system of claim 11, further comprising a temperature sensor, wherein the temperature sensor is arranged to monitor a temperature of the one or more electronic devices and the temperature sensor is coupled to the controller.

13. The system of claim 11, wherein the controller is coupled to the one or more electronic devices, and wherein the controller is arranged to monitor a power consumption level of the one or more electronic devices.

14. The system of claim 9, further comprising a controller operable to activate and deactivate the pump.

* * * * *